US012665003B2

(12) United States Patent
Jeon et al.

(10) Patent No.: US 12,665,003 B2
(45) Date of Patent: Jun. 23, 2026

(54) REFERENCE VOLTAGE CALIBRATION APPARATUS IN MEMORY INTERFACE

(71) Applicant: ELECTRONICS AND TELECOMMUNICATIONS RESEARCH INSTITUTE, Daejeon (KR)

(72) Inventors: Young-Deuk Jeon, Sejong-si (KR); Young-Su Kwon, Daejeon (KR); Yi-Gyeong Kim, Daejeon (KR); Su-Jin Park, Daejeon (KR); Min-Hyung Cho, Daejeon (KR)

(73) Assignee: ELECTRONICS and TELECOMMUNICATIONS RESEARCH INSTITUTE, Daejeon (KR)

( * ) Notice: Subject to any disclaimer, the term of this patent is extended or adjusted under 35 U.S.C. 154(b) by 126 days.

(21) Appl. No.: 18/820,449

(22) Filed: Aug. 30, 2024

(65) Prior Publication Data

US 2025/0157499 A1      May 15, 2025

(30) Foreign Application Priority Data

Nov. 9, 2023 (KR) ........................ 10-2023-0154481
May 31, 2024 (KR) ........................ 10-2024-0071843

(51) Int. Cl.
*G11C 5/14* (2006.01)
*H03H 11/04* (2006.01)

(52) U.S. Cl.
CPC .............. *G11C 5/147* (2013.01); *H03H 11/04* (2013.01); *G11C 2207/2254* (2013.01)

(58) Field of Classification Search
CPC .. G11C 5/147; G11C 2207/2254; H03H 11/04
(Continued)

(56) References Cited

U.S. PATENT DOCUMENTS 4,921,433 A * 5/1990 Biren ..................... H01R 13/60
439/534
9,401,721 B1 7/2016 Barakat et al.
(Continued)

FOREIGN PATENT DOCUMENTS

KR 10-2021-0059598 A 5/2021

OTHER PUBLICATIONS

Junyoung Song, et al., "A 1-V 10-GB/s/pin Single-Ended Transceiver With Controllable Active-Inductor-Based Driver and Adaptively Calibrated Cascaded-Equalizer for Post-LPDDR4 Interfaces", IEEE Transactions on Circuits and Systems-I: Regular Papers, Jan. 2018, vol. 65, No. 1, pp. 331-342.

*Primary Examiner* — Viet Q Nguyen
(74) *Attorney, Agent, or Firm* — Sughrue Mion, PLLC

(57) ABSTRACT

Disclosed herein is a reference voltage calibration apparatus in a memory interface. The reference voltage calibration apparatus includes a first low-pass filter configured to receive a clock signal, a second low-pass filter configured to receive an inverted clock signal that is an inverted signal of the clock signal, a first comparator configured to compare an output of the first low-pass filter with a reference voltage, a second comparator configured to compare an output of the second low-pass filter with the reference voltage, an up/down counter configured to count upward or downward from output values of the first comparator and the second comparator, respectively, and a digital-to-analog converter configured to convert an up/down counter value into an analog signal, and then output the reference voltage, wherein the digital-to-analog converter applies a calibration voltage based on the reference voltage to the first low-pass filter and to the second low-pass filter.

12 Claims, 7 Drawing Sheets

(58) Field of Classification Search
USPC ......................................................... 365/226
See application file for complete search history.

(56)                     References Cited

U.S. PATENT DOCUMENTS

|  |  |  |  |  |
|---|---|---|---|---|
| 9,564,879 | B1 | 2/2017 | Luo et al. | |
| 11,217,299 | B2 * | 1/2022 | Jeon | G11C 11/4076 |
| 12,367,916 | B2 * | 7/2025 | Moon | G11C 11/4074 |
| 2010/0188919 | A1 | 7/2010 | Fox et al. | |
| 2021/0151091 | A1 * | 5/2021 | Jeon | G11C 11/4093 |
| 2023/0403022 | A1 * | 12/2023 | Zhou | H03M 1/1009 |
| 2024/0046976 | A1 * | 2/2024 | Pilolli | G11C 7/222 |
| 2024/0194241 | A1 * | 6/2024 | Jeon | G11C 11/4074 |

* cited by examiner

REFERENCE VOLTAGE CALIBRATION APPARATUS IN MEMORY INTERFACE

CROSS REFERENCE TO RELATED APPLICATIONS

This application claims the benefit of Korean Patent Application No. 10-2023-0154481, filed Nov. 9, 2023 and 10-2024-0071843, filed May 31, 2024, which are hereby incorporated by reference in their entireties into this application.

BACKGROUND OF THE INVENTION

1. Technical Field

The following embodiments relate to memory interface technology.

2. Description of the Related Art

There is a need to calibrate a reference voltage (VREF) used to identify whether data is 1 or 0 in a memory interface.

In a reference voltage (VREF) calibration scheme based on a Low-Pass Filter (LPF) that receives a read data strobe (RDQS) signal as input, several tens or more of clocks may be required until the reference voltage is settled to an intermediate voltage level during a memory initialization period and a long time non-use period. In this case, initial input data received until the output voltage of the LPF is settled may be recognized as a false value.

That is, an existing background VREF calibration scheme based on the low-pass filter (LPF) that receives the RDQS signal as input has limitations.

SUMMARY OF THE INVENTION

An embodiment is intended to enable reference voltage calibration to be rapidly performed even in the state in which, when performing reference voltage calibration based on a Low-Pass Filter (LPF) that receives an RDQS signal as input, the output voltage of the low-pass filter is unknown during a memory initialization period and a long-term non-use period.

In accordance with an aspect, there is provided a reference voltage calibration apparatus in a memory interface, including a first low-pass filter configured to receive a clock signal, a second low-pass filter configured to receive an inverted clock signal that is an inverted signal of the clock signal, a first comparator configured to compare an output of the first low-pass filter with a reference voltage, a second comparator configured to compare an output of the second low-pass filter with the reference voltage, an up/down counter configured to count upward or downward from output values of the first comparator and the second comparator, respectively, and a digital-to-analog converter configured to convert an up/down counter value into an analog signal, and then output the reference voltage, wherein the digital-to-analog converter applies a calibration voltage based on the reference voltage to the first low-pass filter and to the second low-pass filter.

The calibration voltage may have an intermediate value of a high signal and a low signal of the reference voltage.

Each of the first low-pass filter and the second low-pass filter may generate an output value based on the calibration voltage during an initialization period or a period in which a clock signal is not applied.

The first low-pass filter or the second low-pass filter may include a first switch configured to turn on/off the clock signal or the inverted clock signal that is an input signal applied to a filter stage, and the filter stage configured to allow a signal having a frequency lower than a predetermined value from the input signal to pass therethrough, wherein the filter stage includes a resistor having a first end to which the input signal is applied, a capacitor connected between a second end of the resistor and a ground, and a second switch connected to the second end of the resistor and configured to turn on/off the calibration voltage that is input from the digital-to-analog converter.

The second switch may be turned on during an initialization period or the period in which the clock signal is not applied.

The filter stage may be implemented using two or more filter stages, and each of the filter stages may be connected to a second end of a resistor in a previous filter stage.

The filter stage may further include a first current source configured to output a current flowing from a voltage source to a connection node of the filter stage, a second current source configured to output a current flowing from the connection node to a ground, a third switch configured to turn on/off a connection between the first current source and the connection node, and a fourth switch configured to turn on/off a connection between the second current source and the connection node.

In accordance with another aspect, there is provided a low-pass filter in a reference voltage calibration apparatus, including a first switch configured to turn on/off a clock signal or an inverted clock signal that is an input signal applied to a filter stage, and the filter stage configured to allow a signal having a frequency lower than a predetermined value from the input signal to pass therethrough, wherein the filter stage includes a resistor having a first end to which the input signal is applied, a capacitor connected between a second end of the resistor and a ground, and a second switch connected to the second end of the resistor and configured to turn on/off a calibration voltage that is input.

The calibration voltage may have an intermediate value of a high signal and a low signal of a reference voltage.

The second switch may be turned on during an initialization period or a period in which a clock signal is not applied.

The filter stage may be implemented using two or more filter stages, and each of the filter stages may be connected to a second end of a resistor in a previous filter stage.

The filter stage may include a first current source configured to output a current flowing from a voltage source to a connection node of the filter stage, a second current source configured to output a current flowing from the connection node to a ground, a third switch configured to turn on/off a connection between the first current source and the connection node, and a fourth switch configured to turn on/off a connection between the second current source and the connection node.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Figure 1:
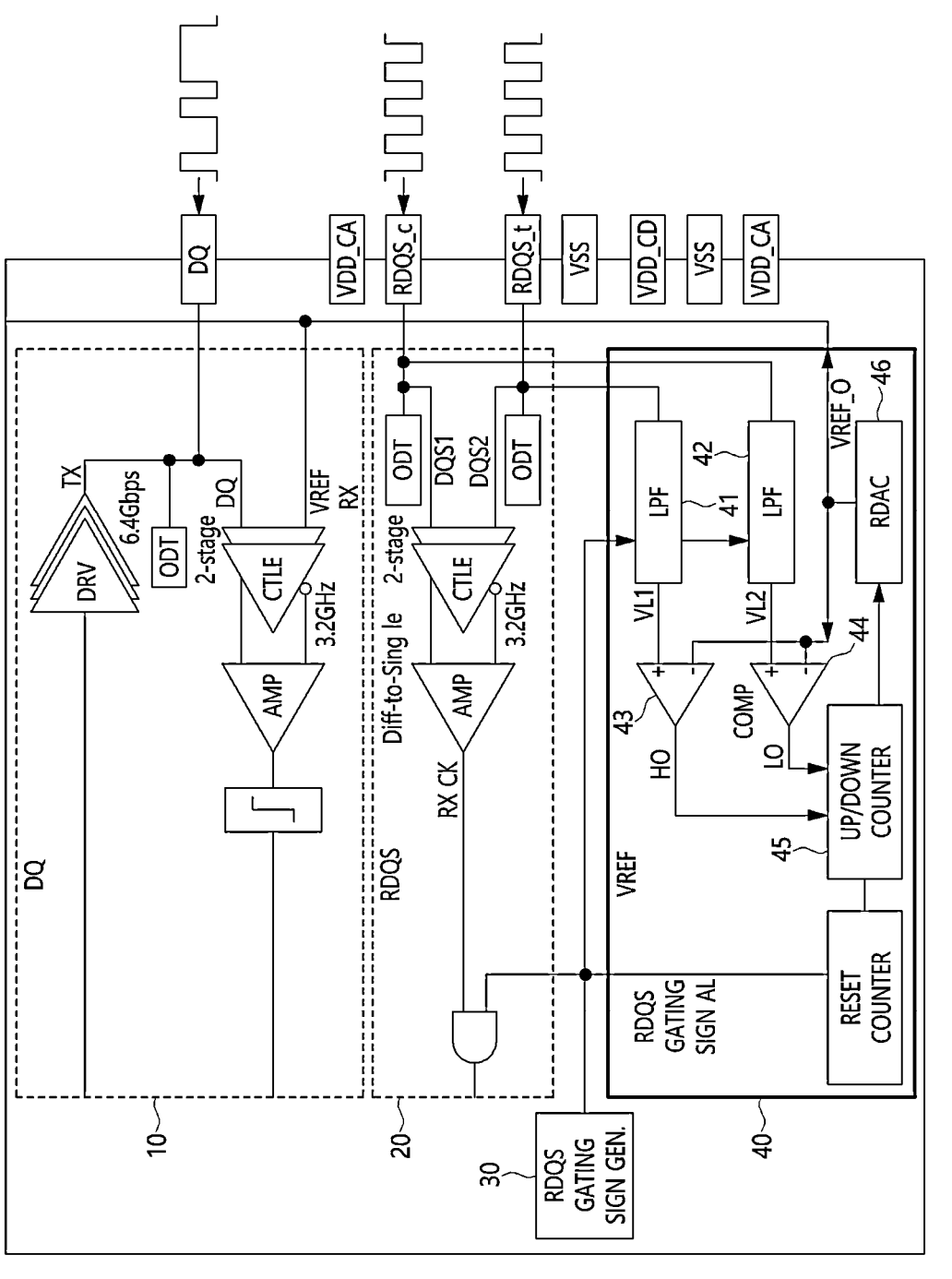
FIG. 1 is a diagram illustrating an example of a reference voltage calibration circuit based on typical low-pass filters.

Advantages and features of the present disclosure and methods for achieving the same will be clarified with reference to embodiments described later in detail together with the accompanying drawings. However, the present disclosure is capable of being implemented in various forms, and is not limited to the embodiments described later, and these embodiments are provided so that this disclosure will be thorough and complete and will fully convey the scope of the present disclosure to those skilled in the art. The present disclosure should be defined by the scope of the accompanying claims. The same reference numerals are used to designate the same components throughout the specification.

It will be understood that, although the terms "first" and "second" may be used herein to describe various components, these components are not limited by these terms. These terms are only used to distinguish one component from another component. Therefore, it will be apparent that a first component, which will be described below, may alternatively be a second component without departing from the technical spirit of the present disclosure.

The terms used in the present specification are merely used to describe embodiments, and are not intended to limit the present disclosure. In the present specification, a singular expression includes the plural sense unless a description to the contrary is specifically made in context. It should be understood that the term "comprises" or "comprising" used in the specification implies that a described component or step is not intended to exclude the possibility that one or more other components or steps will be present or added.

Unless differently defined, all terms used in the present specification can be construed as having the same meanings as terms generally understood by those skilled in the art to which the present disclosure pertains. Further, terms defined in generally used dictionaries are not to be interpreted as having ideal or excessively formal meanings unless they are definitely defined in the present specification.

FIG. 1 is a diagram illustrating an example of a reference voltage calibration circuit based on typical low-pass filters.

Referring to FIG. 1, illustrated is an existing reference voltage (VREF) calibration circuit based on Low-Pass Filters (LPF) that receive read data strobe (RDQS) signals as input.

A VREF calibration block 40 may include a low-pass filter (LPF0) 41 that receives RDQS_t as input, a low-pass filter (LPF1) 42 that receives RDQS_c as input, two comparators 43 and 44 that receive the outputs of the LPFs as inputs, an up/down counter 45 that changes depending on the output values of the comparators, and a Digital-to-Analog Converter (DAC) 46 that outputs an analog voltage VREF_O depending on a counter value.

Figure 2:
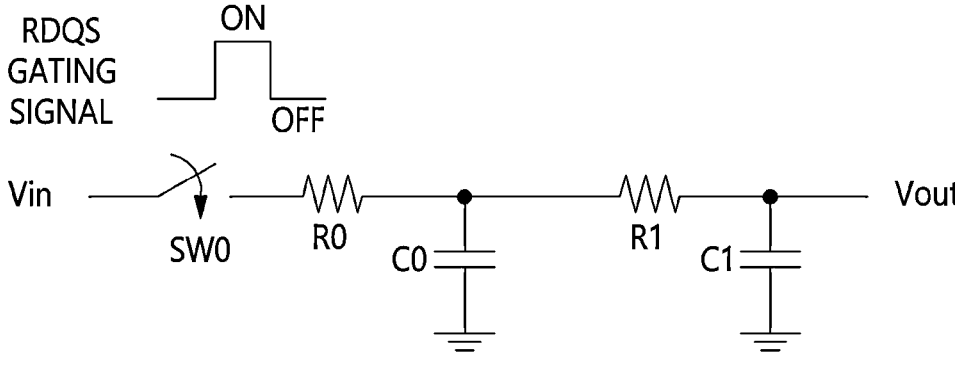
FIG. 2 is a diagram illustrating an example of the internal circuit of the low-pass filter of FIG. 1.

FIG. 2 is a diagram illustrating an example of the internal circuit of each low-pass filter of FIG. 1.

Referring to FIG. 2, each of the Low-Pass Filters (LPFs) 41 and 42 is configured such that a signal is applied to the corresponding LPF through a switch SWO only during a period in which an RDQS signal is applied using an RDQS gating signal. Due thereto, the output of the corresponding LPF may be prevented from being reset during a period in which the RDQS signal is not applied.

However, during a period in which a memory interface is initialized or in which the RDQS signal is not applied for a long time, the output of the LPF changes to an unknown voltage level due to a leakage current occurring through ground/vdd or a switch.

Figure 3:
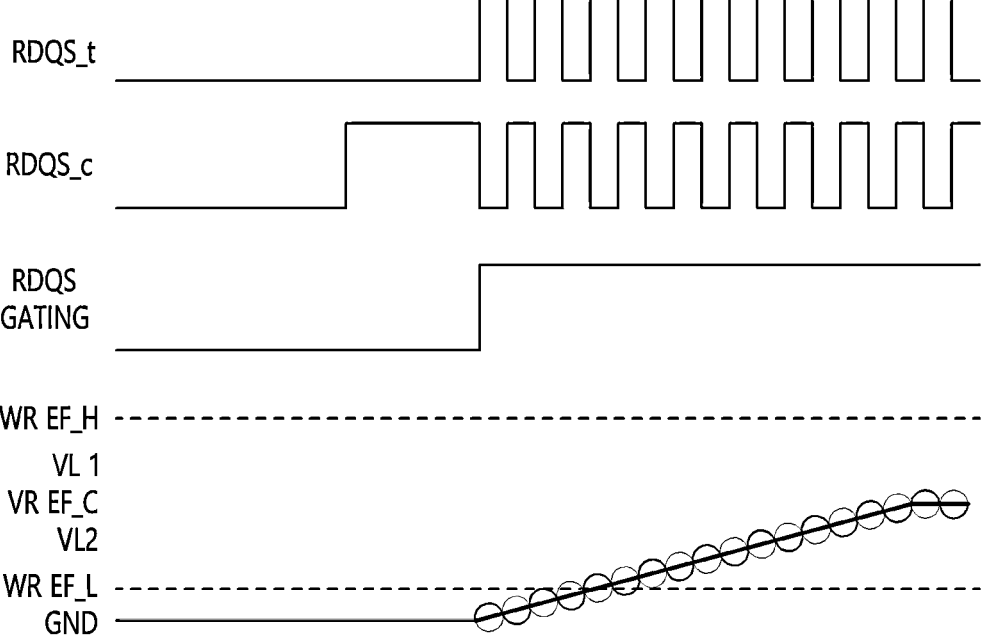
FIG. 3 is a diagram illustrating an example of the outputs of low-pass filters during an initialization period of a memory interface.

FIG. 3 is a diagram illustrating an example of the outputs of low-pass filters during an initialization period of a memory interface.

Referring to FIG. 3, the outputs Vout of low-pass filters LPF0 and LPF1 are illustrated. The outputs Vout of the LPF0 and LPF1 during the initialization period have a ground voltage. Then, when the RDQS signals RDQS_t and RDQS_c start to be applied as input signals Vin after an RDQS gating signal goes high, the outputs Vout of LPF0 and LPF1 start to follow the intermediate voltage level of RDQS_t and RDQS_c.

Although there is a difference depending on the RC value of each Low-Pass Filter (LPF) until the outputs vout are settled to the intermediate voltage level of RDQS_t and RDQS_c, a maximum of several tens of clocks or more may be required. In this case, initial input data appearing until the output voltages of the LPFs are settled may be recognized as an erroneous value.

Figure 4:
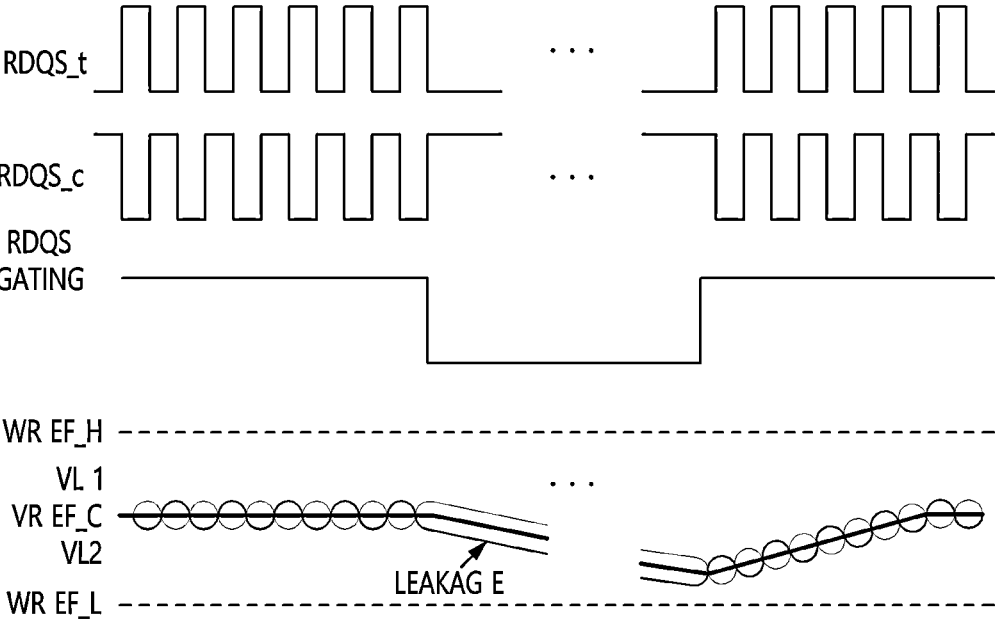
FIG. 4 is a diagram illustrating an example of the outputs of low-pass filters during a period in which read data strobe (RDQS) signals are not applied for a long time in the memory interface.

FIG. 4 is a diagram illustrating an example of the outputs of low-pass filters during a period in which RDQS signals are not applied for a long time in the memory interface.

Referring to FIG. 4, the outputs Vout of LPF0 and LPF1 during the period in which RDQS signals are not applied for a long time are illustrated. During the period in which the RDQS signals are not applied for a long time, the RDQS gating signal becomes 0, thus turning off the switch SWO.

However, because the leakage current of MOS transistors is increasing as a manufacturing process becomes a fine process, a leakage current flowing through the switch SWO during an off-period having a length of several ms or longer influences the corresponding output voltage Vout even if the switch SWO is turned off.

Due thereto, a problem still arises in that it is difficult for the existing circuit to calibrate a reference voltage VREF_O within a short time.

Figure 5:
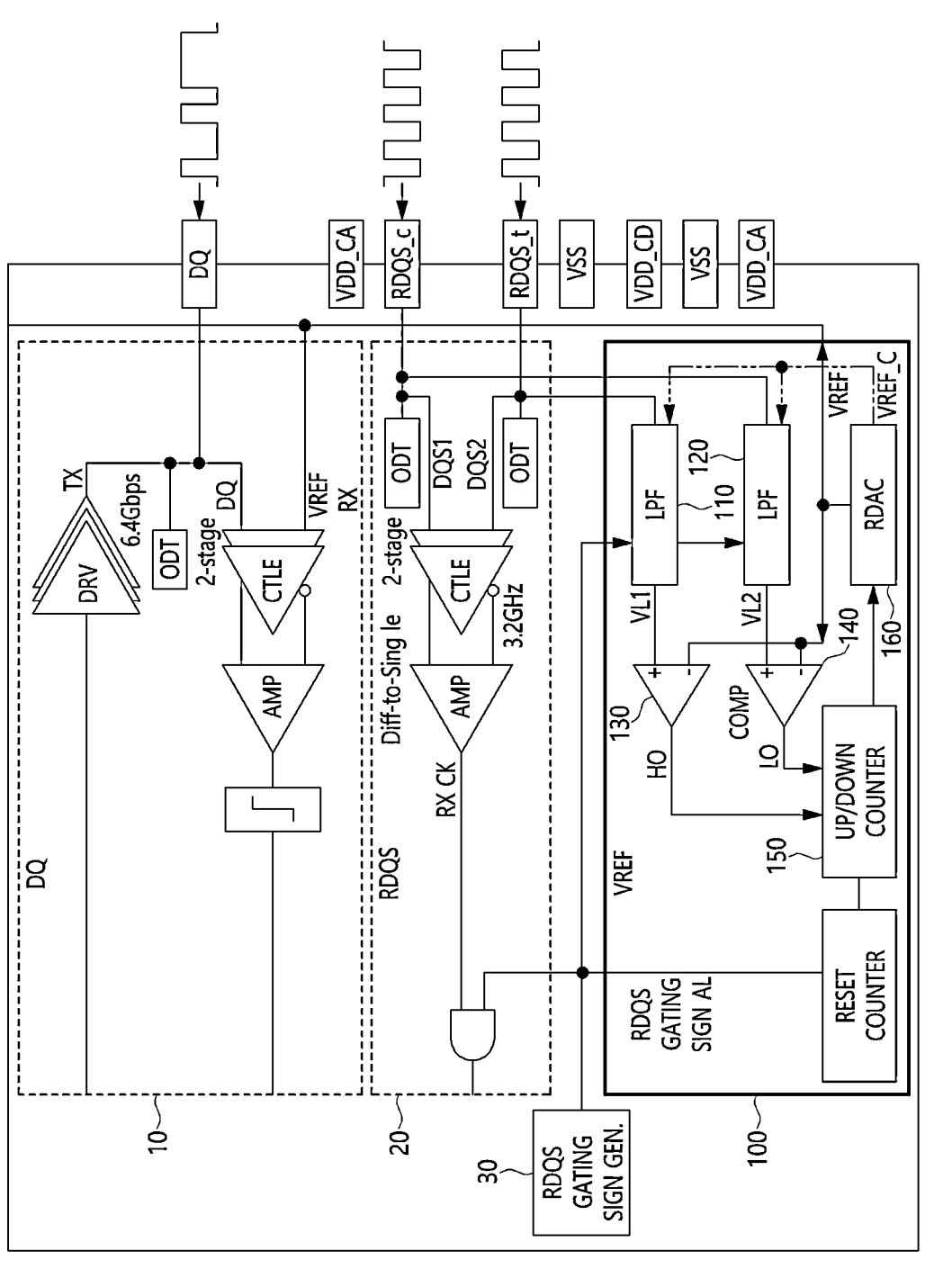
FIG. 5 is a diagram illustrating an example of a reference voltage calibration circuit based on a low-pass filter in a memory interface according to an embodiment.

FIG. 5 is a diagram illustrating an example of a reference voltage calibration circuit based on a low-pass filter in a memory interface according to an embodiment.

Referring to FIG. 5, a reference voltage calibration apparatus (or circuit) 100 in a memory interface according to the embodiment may include a first low-pass filter 110 for receiving a clock signal (RDQS_t), a second low-pass filter 120 for receiving an inverted clock signal (RDQS_c) that is an inverted signal of the clock signal, a first comparator 130 for comparing the output of the first low-pass filter 110 with a reference voltage, a second comparator 140 for comparing the output of the second low-pass filter 120 with the reference voltage, an up/down counter 150 for counting upwards or downwards from respective output values of the first comparator 130 and the second comparator 140, and a digital-to-analog converter (DAC) 160 for converting an up/down counter value into an analog signal, and then outputting the reference voltage.

Here, the digital-to-analog converter 160 may apply a calibration voltage based on the reference voltage both to the first low-pass filter 110 and to the second low-pass filter 120.

That is, although the reference voltage calibration apparatus (circuit) according to the embodiment is implemented as the same block as the conventional reference voltage (VREF) calibration circuit illustrated in FIG. 1, there is a difference in that the calibration voltage VREF_C output from the DAC is applied to the first and second low-pass filters (LPF0) and (LPF1) 110 and 120.

Here, the calibration voltage VREF_C may be an intermediate voltage of the maximum voltage VREF_H and the minimum voltage VREF_L of the reference voltage VREF_O, or a reference voltage VREF_O found through initial reference voltage (VREF) calibration.

Here, the first low-pass filter 110 and the second low-pass filter 120 may generate output values based on the calibration voltage during an initialization period or a period in which a clock signal (RDQS) is not applied.

Figure 6:
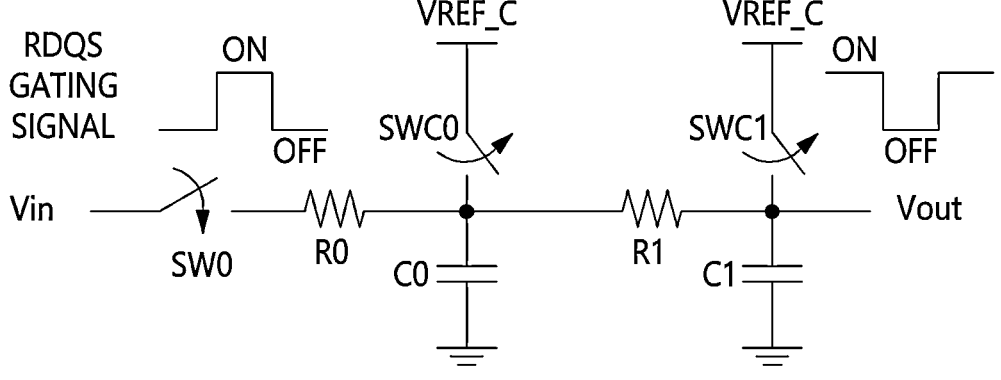
FIG. 6 is a diagram illustrating an example of a low-pass filter circuit to which a calibration voltage (VREF_C) is applied according to an embodiment.

FIG. 6 illustrates an example of a low-pass filter circuit which receives the calibration voltage VREF_C according to an embodiment.

Referring to FIG. 6, a first low-pass filter or a second low-pass filter according to an embodiment may include a first switch SWO which turns on/off a clock signal or an inverted clock signal that is an input signal applied to a filter stage, and the filter stage which allows a signal having a frequency lower than a predetermined value from the input signal to pass therethrough. Here, the filter stage may include a resistor having a first end to which the input signal is applied, a capacitor connected between a second end of the resistor and a ground, and a second switch which is connected to the second end of the resistor to turn on/off a calibration voltage received from the digital-to-analog converter.

Here, the second switch may be turned on during an initialization period or a period in which a clock signal is not applied.

Here, the filter stage may include two or more stages, and the corresponding filter stage may be connected to a second end of a resistor in a previous filter stage.

That is, although the LPF circuit which receives the calibration voltage VREF_C is implemented as a second-order LPF composed of resistors and capacitors in FIG. 6, a proposed circuit technique may be applied regardless of the configuration and the order of the LPF.

The LPF of FIG. 6 illustrates a structure in which switches SWC0 and SWC1 connected to the calibration voltage VREF_C are added to the nodes of the capacitors. Here, the switches SWC0 and SWC1 may be operated in a phase opposite the phase of the input switch SWO.

Figure 7:
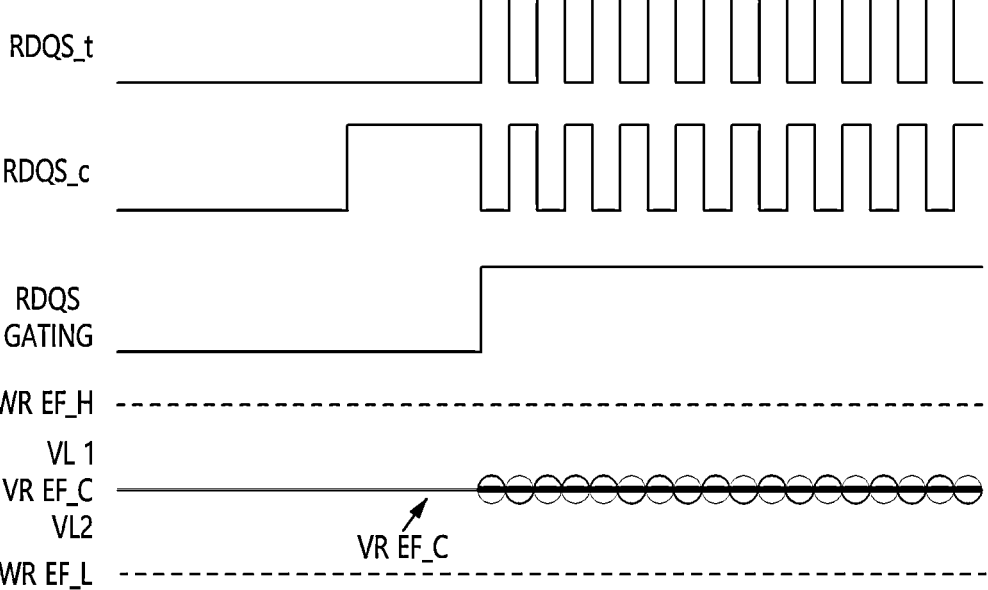
FIG. 7 is a diagram illustrating an example of the output waveform of low-pass filters during an initialization period according to an embodiment.

FIG. 7 is a diagram illustrates an example of the output waveform of low-pass filters during an initialization period according to an embodiment.

Referring to FIG. 7, a memory interface is configured such that the switch SWC0 is turned off during the initialization period, and thus the switches SWC0 and SWC1 are turned on to charge all capacitors with the calibration voltage VREF_C. Thereafter, when initialization is terminated and an RDQS gating signal goes high, the switch SWO is turned on, and the switches SWC0 and SWC1 are turned off. Therefore, the outputs Vout of the low-pass filters LPF0 and LPF1 respectively track the intermediate voltage of RDQS_t and RDQS_c from the calibration voltage VREF_C. Because the calibration voltage VREF_C is similar to the intermediate voltage of RDQS_t and RDQS_c, the outputs Vout may be set to the intermediate voltage of RDQS_t and RDQS_c within a short time.

Figure 8:
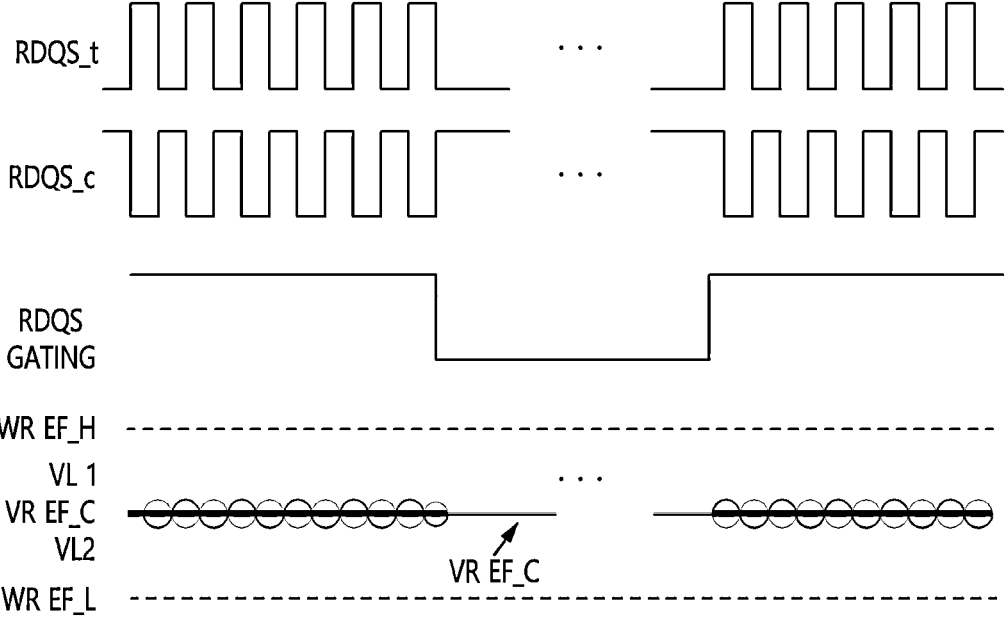
FIG. 8 is a diagram illustrating an example of the output waveform of low-pass filters during a period in which RDQS signals are not applied for a long time according to an embodiment.

FIG. 8 is a diagram illustrating an example of the output waveform of low-pass filters during a period during which a clock signal (RDQS signal) is not applied for a long time according to an embodiment.

Referring to FIG. 8, the operation during the period in which the RDQS signal is not applied for a long time is similar to that during the initialization period. When a switch SWO is turned off in response to an RDQS gating signal, a switch SWC0 and a switch SWC1 are turned on. Here, even if a leakage current occurs through the switch SWO, capacitors C0 and C1 may maintain the calibration voltage VREF_C through the switches SWC0 and SWC1. Thereafter, when the RDQS gating signal goes high, the switch SWO is turned on, and the switches SWC0 and SWC1 are turned off. The output voltages Vout track the intermediate voltage of RDQS_t and RDQS_c from the calibration voltage VREF_C. Therefore, the output voltages Vout may be set to the intermediate voltage of RDQS_t and RDQS_c within a short time.

Figure 9:
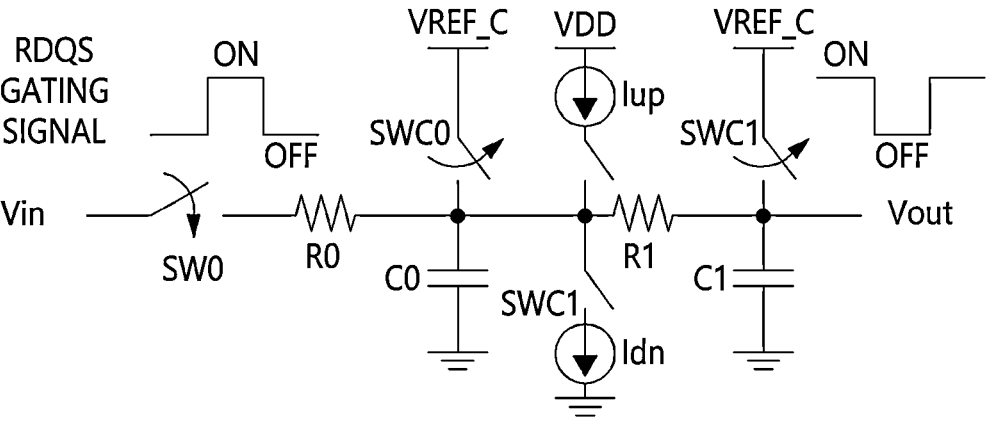
FIG. 9 is a circuit diagram of a low-pass filter to which a voltage control function is added according to an embodiment.

FIG. 9 is a circuit diagram of a low-pass filter to which a voltage control function is added according to another embodiment.

Referring to FIG. 9, a reference voltage calibration apparatus in a memory device according to another embodiment may further include a first current source for outputting current flowing from a voltage source to a connection node of a filter stage, a second current source for outputting current flowing from the connection node to the ground, a third switch for turning on/off a connection between the first current source and the connection node, and a fourth switch for turning on/off a connection between the second current source and the connection node.

That is, the operations of the switches SWO, SWC0, and SWC1 are identical to those in the circuit illustrated in FIG. 6, and current sources Iup and Idn and switches SWI0 and SWI1 are added. The current source Iup functions to increase the voltage Vout by accumulating charge in (by charging) the capacitors through current, and the current source Idn functions to decrease the output voltage Vout by removing charge from (by discharging) the capacitors through the current. The current sources Iup and Idn are controlled by the switches SWI0 and SWI1.

Therefore, by means of the added elements, that is, the current sources Iup and Idn and the switches SWI0 and SWI1, output voltages Vout having the intermediate value of RDQS_t and RDQS_c in an existing scheme may be respectively increased or decreased, and may be controlled to a desired voltage. This enables the output voltages Vout to be adjusted by controlling the switches SWI0 and SWI1 under conditions such as a condition in which the intermediate value of RDQS_t and RDQS_c is not identical due to channel mismatch between RDQS_t and RDQS_c or a condition in which a voltage for distinguishing data DQ from low and high states is not identical to the intermediate voltage due to the offset of a DQ receiver circuit, thus improving the stability of the reference voltage (VREF) calibration circuit.

Figure 10:
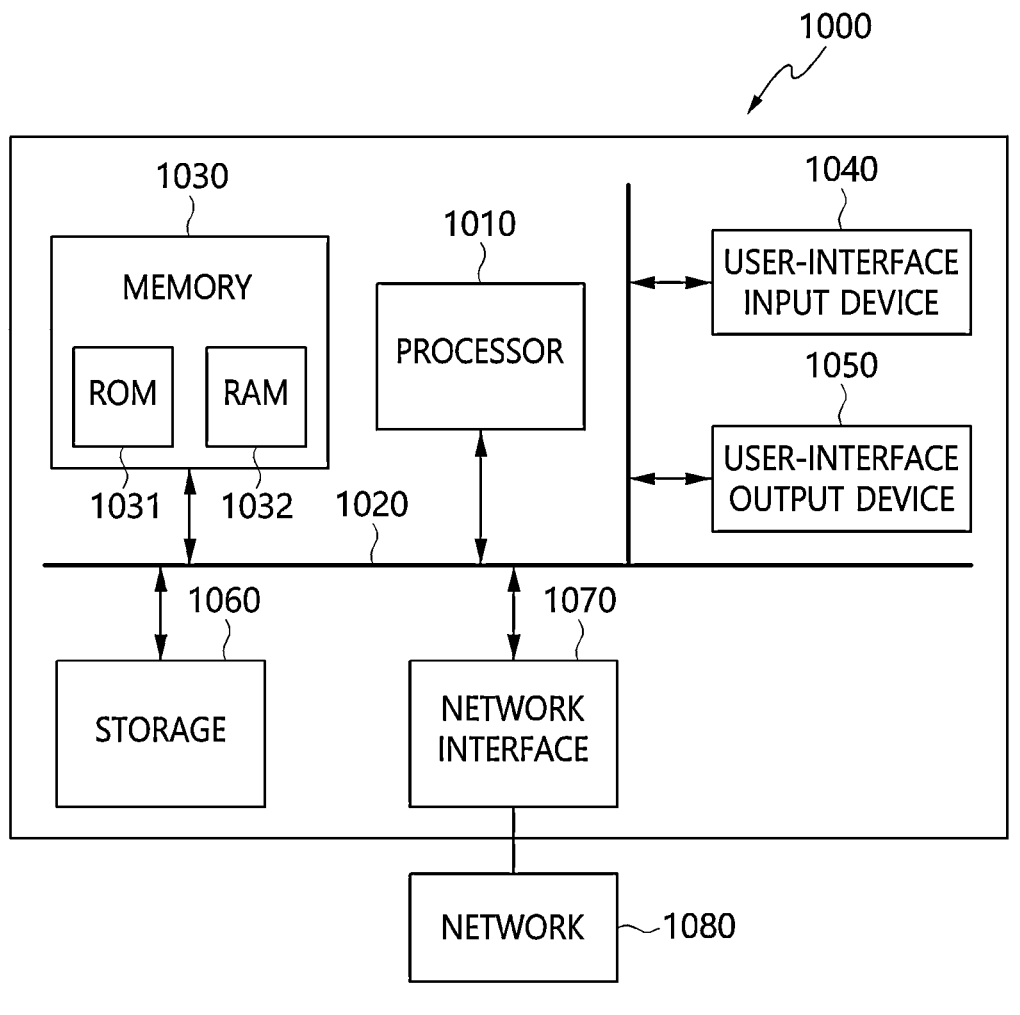
FIG. 10 is a diagram illustrating the configuration of a computer system according to an embodiment.

FIG. 10 is a diagram illustrating the configuration of a computer system according to an embodiment.

The apparatus according to the embodiment may be implemented in a computer system 1000 such as a computer-readable storage medium.

The computer system 1000 may include one or more processors 1010, memory 1030, a user interface input device 1040, a user interface output device 1050, and storage 1060, which communicate with each other through a bus 1020. The computer system 1000 may further include a network interface 1070 connected to a network 1080. Each processor 1010 may be a Central Processing Unit (CPU) or a semiconductor device for executing programs or processing instructions stored in the memory 1030 or the storage 1060. Each of the memory 1030 and the storage 1060 may be a storage medium including at least one of a volatile medium, a nonvolatile medium, a removable medium, a non-removable medium, a communication medium or an information delivery medium, or a combination thereof. For example, the memory 1030 may include Read-Only Memory (ROM) 1031 or Random Access Memory (RAM) 1032.

According to the embodiment, reference voltage calibration may be rapidly performed even in the state in which, when performing reference voltage calibration based on a Low-Pass Filter (LPF) that receives an RDQS signal as input, the output voltage of the low-pass filter is unknown during a memory initialization period and a long-term non-use period, thus preventing errors in data from occurring and improving the background reference voltage (VREF) calibration effect.

Although the embodiments of the present disclosure have been disclosed with reference to the attached drawing, those skilled in the art will appreciate that the present disclosure can be implemented in other concrete forms, without changing the technical spirit or essential features of the disclosure. Therefore, it should be understood that the foregoing embodiments are merely exemplary, rather than restrictive, in all aspects.

What is claimed is:

1. A reference voltage calibration apparatus in a memory interface, comprising:
   a first low-pass filter configured to receive a clock signal;
   a second low-pass filter configured to receive an inverted clock signal that is an inverted signal of the clock signal;
   a first comparator configured to compare an output of the first low-pass filter with a reference voltage;
   a second comparator configured to compare an output of the second low-pass filter with the reference voltage;
   an up/down counter configured to count upward or downward from output values of the first comparator and the second comparator, respectively; and
   a digital-to-analog converter configured to convert an up/down counter value into an analog signal, and then output the reference voltage,
   wherein the digital-to-analog converter applies a calibration voltage based on the reference voltage to the first low-pass filter and to the second low-pass filter.

2. The reference voltage calibration apparatus of claim 1, wherein the calibration voltage has an intermediate value of a high signal and a low signal of the reference voltage.

3. The reference voltage calibration apparatus of claim 1, wherein each of the first low-pass filter and the second low-pass filter generates an output value based on the calibration voltage during an initialization period or a period in which a clock signal is not applied.

4. The reference voltage calibration apparatus of claim 1, wherein the first low-pass filter or the second low-pass filter comprises:
   a first switch configured to turn on/off the clock signal or the inverted clock signal that is an input signal applied to a filter stage; and
   the filter stage configured to allow a signal having a frequency lower than a predetermined value from the input signal to pass therethrough,
   wherein the filter stage comprises:
   a resistor having a first end to which the input signal is applied;
   a capacitor connected between a second end of the resistor and a ground; and
   a second switch connected to the second end of the resistor and configured to turn on/off the calibration voltage that is input from the digital-to-analog converter.

5. The reference voltage calibration apparatus of claim 4, wherein the second switch is turned on during an initialization period or the period in which the clock signal is not applied.

6. The reference voltage calibration apparatus of claim 5, wherein:
   the filter stage is implemented using two or more filter stages, and
   each of the filter stages is connected to a second end of a resistor in a previous filter stage.

7. The reference voltage calibration apparatus of claim 6, wherein the filter stage further comprises:
   a first current source configured to output a current flowing from a voltage source to a connection node of the filter stage;
   a second current source configured to output a current flowing from the connection node to a ground;
   a third switch configured to turn on/off a connection between the first current source and the connection node; and
   a fourth switch configured to turn on/off a connection between the second current source and the connection node.

8. A low-pass filter in a reference voltage calibration apparatus, comprising:
   a first switch configured to turn on/off a clock signal or an inverted clock signal that is an input signal applied to a filter stage; and
   the filter stage configured to allow a signal having a frequency lower than a predetermined value from the input signal to pass therethrough,
   wherein the filter stage comprises:
   a resistor having a first end to which the input signal is applied;
   a capacitor connected between a second end of the resistor and a ground; and
   a second switch connected to the second end of the resistor and configured to turn on/off a calibration voltage that is input.

9. The low-pass filter of claim 8, wherein the calibration voltage has an intermediate value of a high signal and a low signal of a reference voltage.

10. The low-pass filter of claim 8, wherein the second switch is turned on during an initialization period or a period in which a clock signal is not applied.

11. The low-pass filter of claim 10, wherein:

the filter stage is implemented using two or more filter stages, and each of the filter stages is connected to a second end of a resistor in a previous filter stage.

12. The low-pass filter of claim 11, wherein the filter stage further comprises:

a first current source configured to output a current flowing from a voltage source to a connection node of the filter stage;

a second current source configured to output a current flowing from the connection node to a ground;

a third switch configured to turn on/off a connection between the first current source and the connection node; and a fourth switch configured to turn on/off a connection between the second current source and the connection node.

\* \* \* \* \*